United States Patent
Meng et al.

(10) Patent No.: US 10,050,181 B2
(45) Date of Patent: Aug. 14, 2018

(54) LIGHT EMITTING DIODE AND FABRICATION METHOD THEREOF

(71) Applicant: XIAMEN SANAN OPTOELECTRONICS TECHNOLOGY CO., LTD., Xiamen (CN)

(72) Inventors: Cheng Meng, Xiamen (CN); Chun-Yi Wu, Xiamen (CN); Ching-Shan Tao, Xiamen (CN); Duxiang Wang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/647,127

(22) Filed: Jul. 11, 2017

(65) Prior Publication Data

US 2017/0309786 A1  Oct. 26, 2017

Related U.S. Application Data

(63) Continuation of application No. PCT/CN2015/097539, filed on Dec. 16, 2015.

(30) Foreign Application Priority Data

Mar. 5, 2015 (CN) .......................... 2015 1 0097522

(51) Int. Cl.
| | |
|---|---|
| *H01L 33/42* | (2010.01) |
| *H01L 33/44* | (2010.01) |
| *H01L 33/46* | (2010.01) |
| *H01L 33/22* | (2010.01) |
| *H01L 33/62* | (2010.01) |
| *H01L 33/00* | (2010.01) |
| *H01L 33/30* | (2010.01) |
| *H01L 51/52* | (2006.01) |
| *H01L 33/60* | (2010.01) |

(52) U.S. Cl.
CPC .......... *H01L 33/44* (2013.01); *H01L 33/0079* (2013.01); *H01L 33/22* (2013.01);
(Continued)

(58) Field of Classification Search
CPC ...... H01L 33/42; H01L 33/60; H01L 51/5203
(Continued)

(56) References Cited

U.S. PATENT DOCUMENTS

| | | | |
|---|---|---|---|
| 9,401,455 B1* | 7/2016 | Zhang | .................... H01L 33/325 |
| 2005/0088080 A1* | 4/2005 | Cheng | ................. H01L 51/5092 |
| | | | 313/504 |

(Continued)

FOREIGN PATENT DOCUMENTS

| | | |
|---|---|---|
| CN | 104134723 A | 11/2014 |
| CN | 104300055 A | 1/2015 |

*Primary Examiner* — George Fourson, III

(74) *Attorney, Agent, or Firm* — Syncoda LLC; Feng Ma; Junjie Feng

(57) ABSTRACT

A light-emitting diode (LED) structure and a fabrication method thereof effectively enhance external extraction efficiency of the LED, which includes: a light-emitting epitaxial laminated layer, a transparent dielectric layer, and a transparent conductive layer forming a reflectivity-enhancing system; and a metal reflective layer. The light-emitting epitaxial laminated layer has opposite first and second surfaces, and includes an n-type semiconductor layer, a light emitting layer, and a p-type semiconductor layer. The transparent dielectric layer is on the second surface, inside which are conductive holes. The transparent conductive layer is located on one side surface of the transparent dielectric layer distal from the light-emitting epitaxial laminated layer. The metal reflective layer is located on one side surface of the transparent conductive layer distal from the transparent dielectric layer. Refractivity of the transparent dielectric layer is less than that of the light-emitting epitaxial laminated layer and the transparent conductive layer.

19 Claims, 13 Drawing Sheets

(52) U.S. Cl.
CPC .............. *H01L 33/46* (2013.01); *H01L 33/62* (2013.01); *H01L 33/30* (2013.01); *H01L 33/42* (2013.01); *H01L 33/60* (2013.01); *H01L 51/5203* (2013.01); *H01L 2933/0016* (2013.01); *H01L 2933/0025* (2013.01); *H01L 2933/0066* (2013.01)

(58) Field of Classification Search
USPC .......................................................... 257/98
See application file for complete search history.

(56) References Cited

U.S. PATENT DOCUMENTS

| | | | |
|---|---|---|---|
| 2008/0001538 A1* | 1/2008 | Cok ....................... | B82Y 20/00 313/506 |
| 2008/0197764 A1* | 8/2008 | Bechtel ............... | H01L 51/5268 313/499 |
| 2008/0218068 A1* | 9/2008 | Cok ..................... | H05B 33/145 313/505 |
| 2010/0032699 A1* | 2/2010 | Lee ..................... | B32B 37/1018 257/98 |
| 2010/0123153 A1* | 5/2010 | Lin ......................... | H01L 33/42 257/98 |
| 2010/0213485 A1* | 8/2010 | McKenzie .............. | H01L 33/20 257/98 |
| 2010/0301362 A1* | 12/2010 | Iizuka ................... | H01L 33/387 257/98 |
| 2012/0229020 A1* | 9/2012 | Yonehara ............ | H01L 51/5072 313/504 |
| 2016/0164045 A1* | 6/2016 | Kwon ................. | H01L 51/0096 438/29 |
| 2016/0329525 A1* | 11/2016 | Lee ..................... | H01L 51/5268 |

\* cited by examiner

LIGHT EMITTING DIODE AND FABRICATION METHOD THEREOF

CROSS-REFERENCE TO RELATED APPLICATIONS

The present application is a continuation of, and claims priority to, PCT/CN2015/097539 filed on Dec. 16, 2015, which claims priority to Chinese Patent Application No. 201510097522.2 filed on Mar. 5, 2015. The disclosures of these applications are hereby incorporated by reference in their entirety.

BACKGROUND

In recent years, light emitting diode (LED) has been widely applied and plays an increasingly more important role in various fields like display system, lighting system and automobile tail light. The LED with AlGaInP-based light-emitting layer has high internal quantum efficiency. However, external quantum efficiency of conventional LED has been restricted by many factors, like internal total reflection, metal electrode blocking and light absorption by GaAs semiconductor material. For those LEDs growing over light-absorption substrates, a good part of light is finally absorbed by the substrate. Therefore, for those conventional LED structures, external quantum efficiency remains low even internal photoelectric converting efficiency is high. Methods to improve LED light extraction efficiency include thinning window layer, surface roughening, transparent substrate, inverted pyramid structure, etc.

SUMMARY

The present disclosure provides a light emitting diode that effectively enhances external extraction efficiency thereof Technical approaches of the present disclosure can include: a light-emitting diode (LED), comprising a light-emitting epitaxial laminated layer, a transparent dielectric layer, a transparent conductive layer and a metal reflective layer, wherein, the light-emitting epitaxial laminated layer has a first surface and a second surface that are opposite to each other, comprising an n-type semiconductor layer, a light emitting layer and a p-type semiconductor layer; the transparent dielectric layer is located on the second surface of the light-emitting epitaxial laminated layer and is in direct contact with the light-emitting epitaxial laminated layer, inside which are conductive holes; the transparent conductive layer is located on one side surface of the transparent dielectric layer that is far from the light-emitting epitaxial laminated layer; the metal reflective layer is located on one side surface of the transparent conductive layer that is far from the transparent dielectric layer; and refractivity of the transparent dielectric layer is less than that of the light-emitting epitaxial laminated layer and the transparent conductive layer. In this present disclosure, the light-emitting epitaxial laminated layer can be equivalent to a high-refractivity layer, the transparent dielectric layer can be equivalent to a low-refractivity and high-transmittance layer; and the transparent conductive layer can be equivalent to a high-refractivity and high-transmittance conductive layer. The three layers form a reflectivity-enhancing system. Further, the transparent conductive layer and the metal reflective layer form an omni-directional reflector structure.

In some embodiments, refractivity of the light-emitting epitaxial laminated layer, the transparent dielectric layer and the transparent conductive layer is r1, r2 and r3 respectively, with relationship satisfying: $r2<r3<r1$.

In some embodiments, roughness of the second surface of the light-emitting epitaxial laminated layer is less than that of the first surface. In some embodiments, the second surface of the light-emitting epitaxial laminated layer is a surface at one side of the n-type semiconductor layer.

In some embodiments, the transparent dielectric layer is doped with foaming particles which generate gas bubbles when heated, thereby reducing refractivity of the transparent dielectric layer and achieving scattering effect. This enhances the total reflection probability of the interface between the emitting epitaxial layer and the transparent dielectric layer. In some embodiments, the foaming particles are selected from any one of $CaCO_3$, $BaCO_3$, $Ca(HCO_3)_2$, $Na_2CO_3$, $NaHCO_3$ or their combinations.

In some embodiments, the transparent conductive layer has good adhesiveness and bridges the light-emitting epitaxial laminated layer and the metal reflective layer. This increases interface strength and avoids the metal reflective layer from stripping off the epitaxy. In some preferred embodiments, the transparent conductive layer is a sputtered ITO material layer (S-ITO for short), and the metal reflective layer is an Ag reflector. As the S-ITO and the Ag reflector are well adhesive to the light-emitting epitaxial laminated layer, and would not have chemical reaction with the light-emitting epitaxial laminated layer under high temperature, the smoothness of the interface between the light-emitting epitaxial laminated layer and the transparent conductive layer is not affected. Therefore, this improves mirror reflectivity and further enhances light extraction rate of LED. In some preferred embodiments, the S-ITO is in molecular state and distributes on the transparent dielectric layer in granular shape. Preferred thickness is 10-100 Å, within which, the film is not yet formed and is in molecular state with least light absorption. In addition, the S-ITO is distributed on the surface of the transparent dielectric layer in granular shape, thereby having little effect on mirror smoothness.

In some embodiments, the first surface of the light-emitting epitaxial laminated layer has a plurality of roughened patterns in honeycomb structure appearing in regular hexagon. This roughened structure has high utility rate of space and effectively enhances light extraction rate. In some embodiments, the honeycomb structure is hemispherical.

The present disclosure also provides a fabrication method of light emitting diode, mainly comprising the steps below: a light emitting diode fabrication method, comprising: 1) forming a light-emitting epitaxial laminated layer on the growth substrate, which comprises at least an n-type semiconductor layer, a light emitting layer and a p-type semiconductor layer; 2) fabricating an electrode on the p-side surface of the light-emitting epitaxial laminated layer, and annealing to form ohmic contact; 3) bonding a temporary substrate on the p-side surface of the light-emitting epitaxial laminated layer; 4) removing the growth substrate, and exposing the n-side surface; 5) consecutively forming a transparent conductive layer and a metal reflective layer and annealing to form ohmic contact on the n-side surface of the light-emitting epitaxial laminated layer; 6) bonding a substrate on the metal reflective layer and removing the temporary substrate. In this fabrication method, thermal treatment is done before substrate bonding to form n-side ohmic contact and p-side ohmic contact. As a result, thermal treatment is not required after evaporation of the metal reflective layer, which may loss luminance.

In another aspect, a light-emitting system is provided including a plurality of the LEDs. The light-emitting system can be used for lighting, signage, display, etc.

Other features and advantages of various embodiments of the present disclosure will be described in detail in the following specification, and it is believed that such features and advantages will become more obvious in the specification or through implementations of this invention. The purposes and other advantages of the present disclosure can be realized and obtained in the structures specifically described in the specifications, claims and drawings.

BRIEF DESCRIPTION OF THE DRAWINGS

The accompanying drawings, which are included to provide a further understanding of the invention and constitute a part of this specification, together with the embodiments, are therefore to be considered in all respects as illustrative and not restrictive. In addition, the drawings are merely illustrative, which are not drawn to scale.

DETAILED DESCRIPTION

The light emitting diode structure is described in detail with reference to the schematic diagrams, to help understand and practice the disclosed embodiments, regarding how to solve technical problems using technical approaches for achieving the technical effects. It should be understood that the embodiments and their characteristics described in this disclosure may be combined with each other and such technical proposals are deemed to be within the scope of this disclosure without departing from the spirit of this invention.

Figure 1:
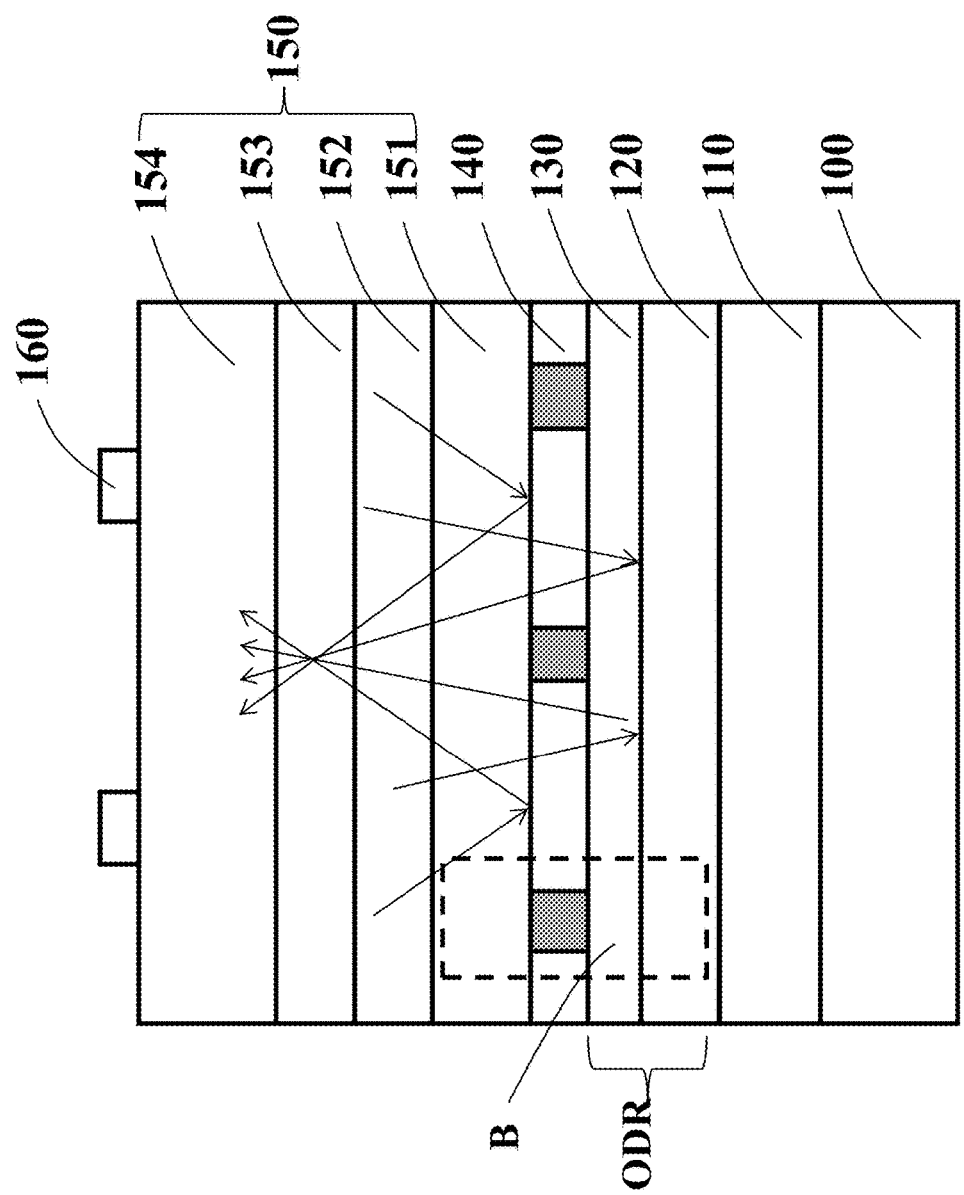
FIG. 1 is a sectional view showing the light emitting diode structure in accordance with Embodiment 1 of the present disclosure.

FIG. 1 shows the light emitting diode according to the first preferred embodiment of the present disclosure, comprising from bottom to up: a substrate 100, a metal bonding layer 110, a metal reflective layer 120, a transparent conductive layer 130, a transparent dielectric layer 140, and a light-emitting epitaxial laminated layer 150, wherein, the light-emitting epitaxial laminated layer 150 comprises a first semiconductor layer 151, a light emitting layer 152 and a second semiconductor layer 153. When the first semiconductor layer 151 is a p-type semiconductor, the second semiconductor layer 153 can be an n-type semiconductor with different electrical property. On the contrary, when the first semiconductor layer 151 is an n-type semiconductor, the second semiconductor layer 153 can be a p-type semiconductor with different electrical property. The light emitting layer 152 is between the first semiconductor layer 151 and the second semiconductor layer 153, which can be a neutral -type, a p -type or an n -type semiconductor. When the applied current passes through the light-emitting epitaxial laminated layer, the light emitting layer 152 emits light. When the light emitting layer 152 is made of nitride-based material, blue or green light will be emitted; when made of AlInGaP-based material, red, orange or yellow light in amber color will be emitted. In this embodiment, the first semiconductor layer 151 is an n-type semiconductor, and the second semiconductor layer 153 is a p-type semiconductor. The light emitting layer 152 is made of AlGaInP-based material. Above the second semiconductor layer 153 is a GaP window layer.

Figure 2:
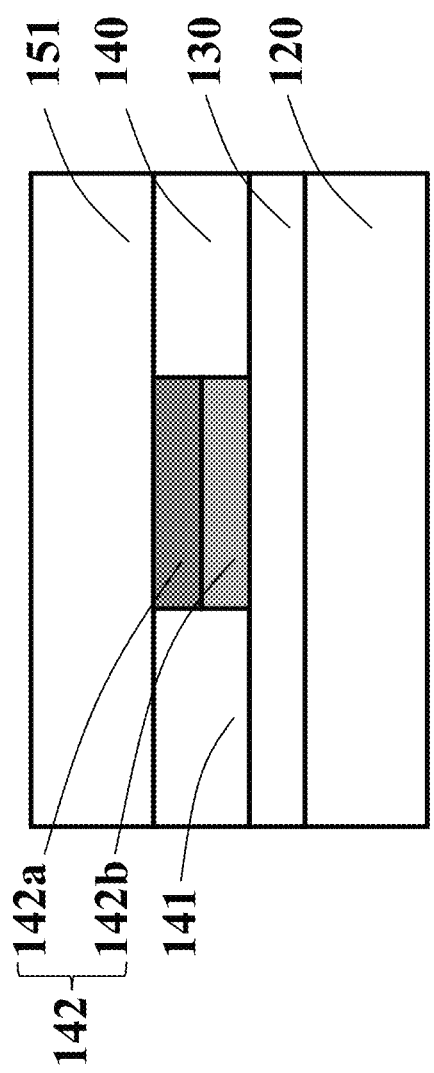
FIG. 2 is a partial enlarged view of portion B in FIG. 1.

Specifically, the metal reflective layer 120 is a high-reflectivity material layer, and Ag reflector is preferred. Due to poor adhesiveness of the Ag reflector and the epitaxy, the transparent conductive layer 130 can be an ITO material layer that is well adhesive to both the epitaxy and the Ag reflector. This improves adhesive strength and forms an ODR system with the mirror. In some embodiments, for the transparent conductive layer 130, S-ITO is preferred, and preferred thickness is 10-100 Å, within which, the ITO film is not yet formed and is distributed on the surface of the transparent dielectric layer 140 in modular state. As the S-ITO is well adhesive to the epitaxy, and would not have chemical reaction with the epitaxy under high temperature, which may damage mirror smoothness and affect reflectivity. The transparent dielectric layer 140 is composed of a silicon dioxide material layer 141, inside which are conductive holes 142. The conductive holes can directly be filled with transparent conductive materials, or be composed of an n-GaAs layer 142a and an n-type ohmic contact layer 142b; FIG. 2 is a partial enlarged view of B in FIG. 1.

In this embodiment, the transparent conductive layer 130 and the metal reflective layer 120 form an omni-directional reflective structure. A transparent dielectric layer 140 is added between the transparent conductive layer 130 and the light-emitting epitaxial laminated layer 150, wherein, the transparent dielectric layer 140 is a low-refractivity and high-transmittance layer, and the refractivity is less than that of the light-emitting epitaxial laminated layer and the transparent conductive layer. The transparent conductive layer 130 and the light-emitting epitaxial laminated layer 150 form a reflectivity-enhancing system, which also serves as an n-type current blocking layer.

In general, in a light emitting epitaxial structure, roughness of the n-side bottom surface is less than that of the p-side upper surface. Taking AlGaInP material as an example, the growth substrate is often made of GaAs, and roughness Ra of the n-side bottom surface can be equivalent to that of the GaAs substrate, which is about 0.174 nm, and roughness Ra of the p-side surface is about 3.56 nm. When light enters the optically thinner medium from optically denser medium, a smooth surface is more prone to total reflection than a roughened surface. In the light emitting diode as shown in FIG. 1, the first semiconductor layer is an n-type semiconductor, adjoining to the omni-directional reflective structure. In this omni-directional reflective system, roughness of the interface between the optically denser medium (the first semiconductor layer 151) and the optically thinner medium (the transparent dielectric layer 140) is small. Therefore, downward light emitted from the light emitting layer is much more likely to be totally reflected back to the inside part of the epitaxy, thus significantly enhancing light extraction rate of LED.

Figure 3:
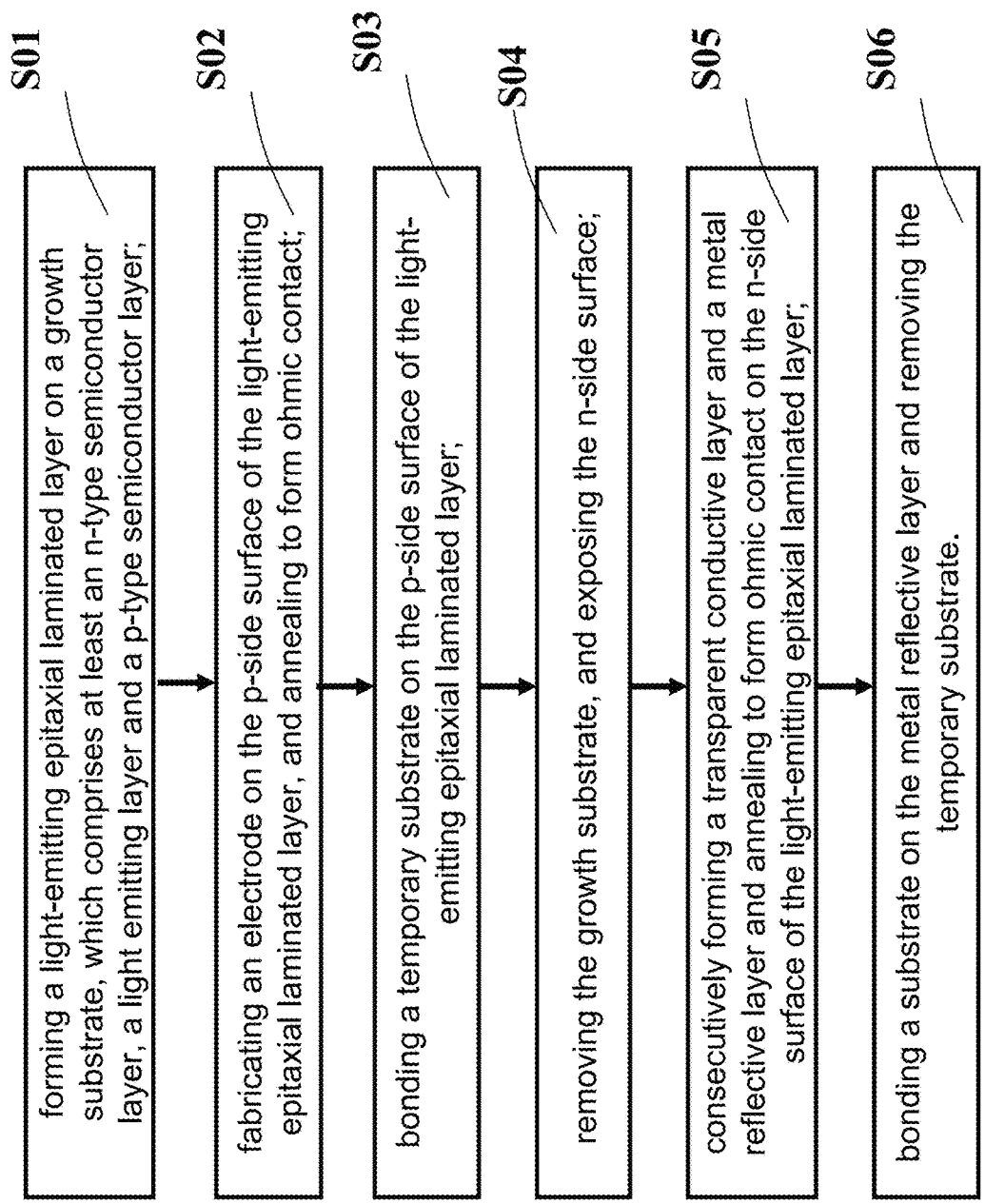
FIG. 3 is a flow diagram of fabricating the light emitting diode as shown in FIG. 1.

FIG. 3 is a flow diagram of the light emitting diode as shown in FIG. 1, mainly comprising steps below: S01: forming a light-emitting epitaxial laminated layer on the growth substrate, which comprises at least an n-type semiconductor layer, a light emitting layer and a p-type semiconductor layer; S02: fabricating an electrode on the p-side surface of the light-emitting epitaxial laminated layer, and annealing to form ohmic contact; S03: bonding a temporary substrate on the p-side surface of the light-emitting epitaxial laminated layer; S04: removing the growth substrate, and exposing the n-side surface; S05: consecutively forming a transparent conductive layer and a metal reflective layer and annealing to form ohmic contact on the n-side surface of the light-emitting epitaxial laminated layer; S06: bonding a substrate on the metal reflective layer and removing the temporary substrate Detailed descriptions will be given to the fabrication method of the light emitting diode with reference to FIGS. 4-10.

Figure 4:
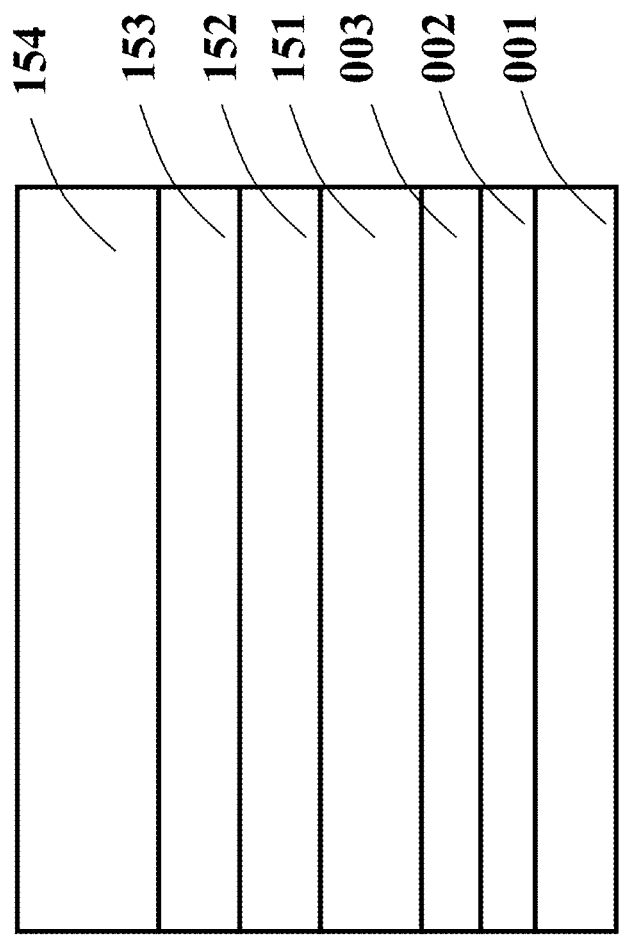
FIG. 4 is a sectional view of a first step of a manufacturing process for the light emitting diode as shown in FIG. 1.

With reference to FIG. 4, consecutively form an InGaP blocking layer 002, an n-type GaAs ohmic contact layer 003, an n-type semiconductor layer 151, a light emitting layer 152, a p-type semiconductor layer 153 and a window layer 154 via epitaxial growth on the GaAs substrate 001.

Figure 5:
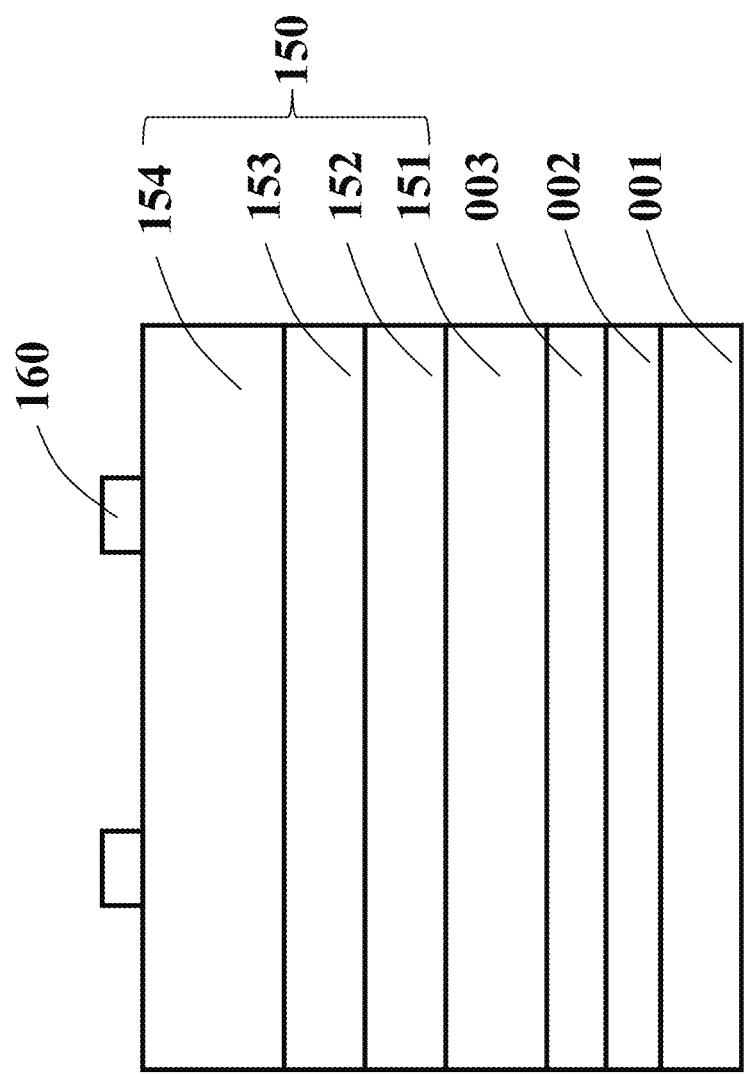
FIG. 5 is a sectional view of a second step of a manufacturing process for the light emitting diode as shown in FIG. 1.

With reference to FIG. 5, fabricate a p-electrode 160 on the surface of the window layer 154, and form ohmic contact via thermal treatment.

Figure 6:
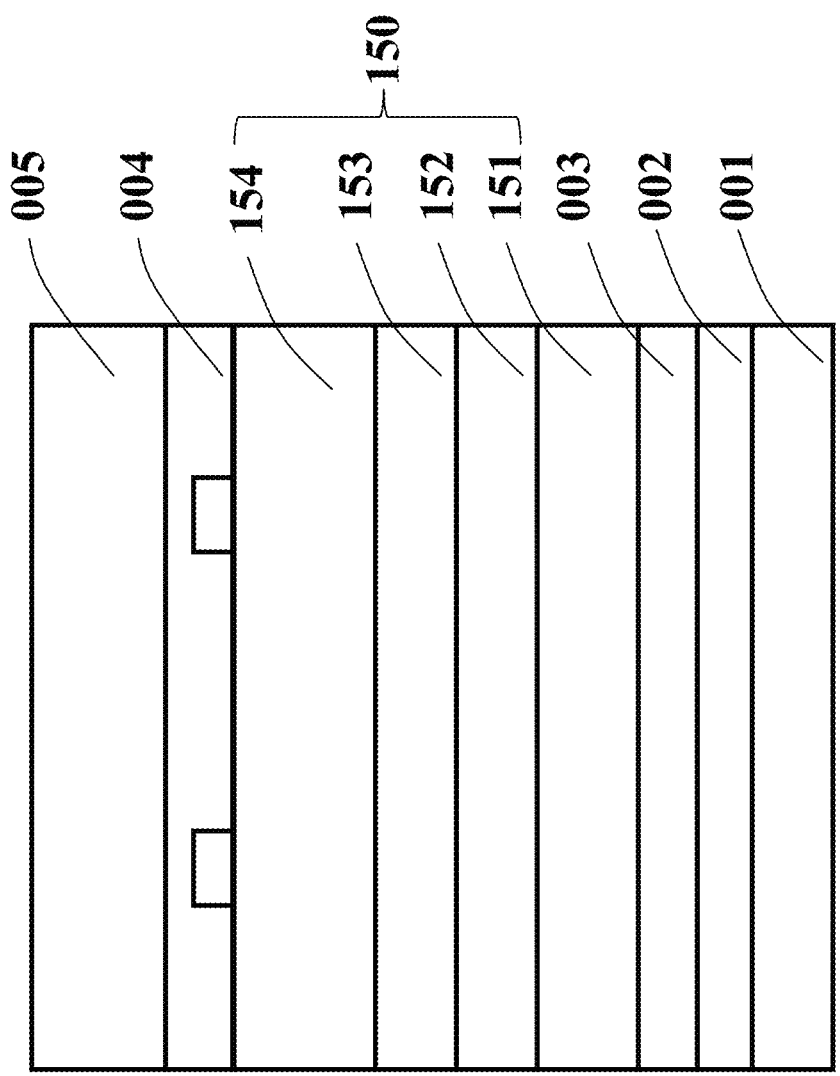
FIG. 6 is a sectional view of a third step of a manufacturing process for the light emitting diode as shown in FIG. 1.
Figure 7:
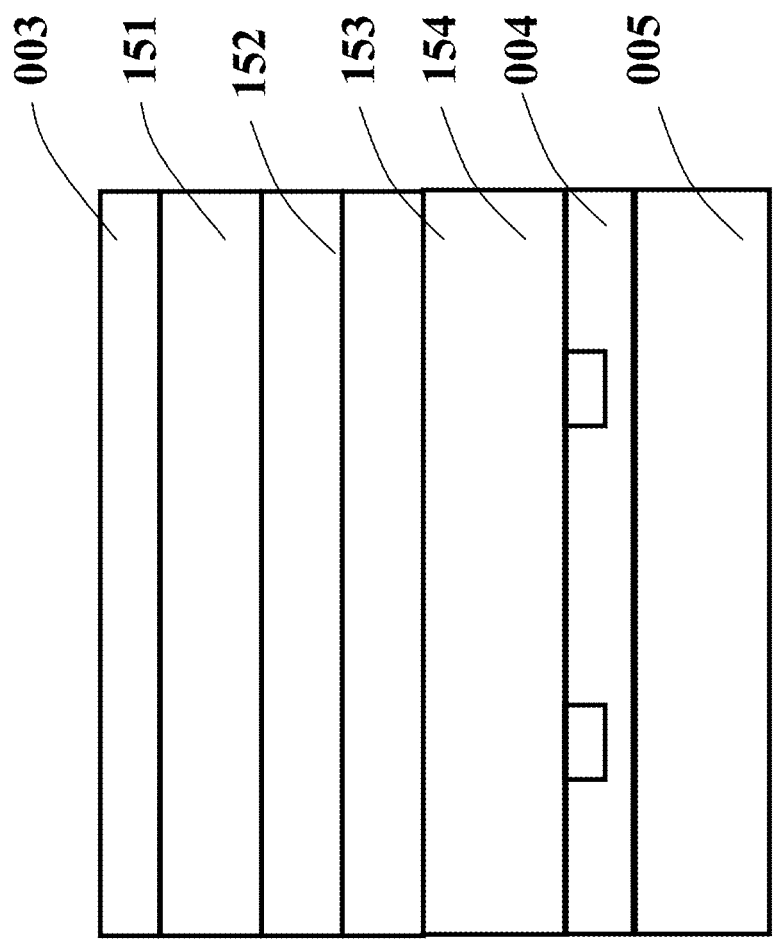
FIG. 7 is a sectional view of a fourth step of a manufacturing process for the light emitting diode as shown in FIG. 1.

With reference to FIG. 6 and FIG. 7, bond a temporary substrate 005 via the bonding layer 004 on the surface of the window layer 154, and remove the GaAs substrate 001 and the InGaP blocking layer 002 to expose the surface of the n-type GaAs ohmic contact layer 003.

Figure 8:
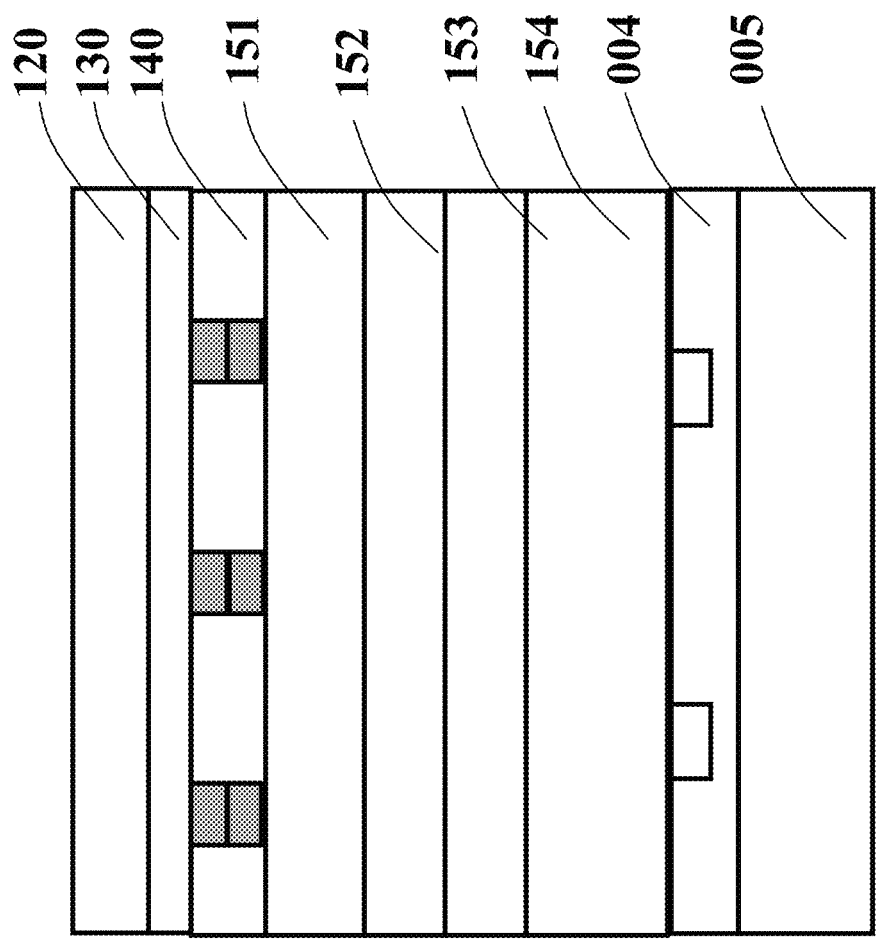
FIG. 8 is a sectional view of a fifth step of a manufacturing process for the light emitting diode as shown in FIG. 1.

With reference to FIG. 8, define a conductive area on the surface of the n-type GaAs ohmic contact layer 003, and remove the n-type GaAs ohmic contact layer 003 in the non-conductive area via etching. Form n-type ohmic contact metal on the n-type GaAs ohmic contact layer in the conductive area; and form a transparent dielectric layer 140 in the non-conductive zone; next, form an ITO layer as the transparent conductive layer 130 via sputtering on the transparent dielectric layer 140; then, form an Ag reflector as the metal reflective layer 120 on the transparent conductive layer 140, and finally form an n-side ohmic contact through thermal treatment. The metal reflective layer is located at the n-side surface of the light emitting layer. Due to lattice match of the n-side material layer and the GaAs substrate, the surface would be particularly smooth during crystal growth, and roughness is significantly less than that of the p-side surface.

Figure 9:
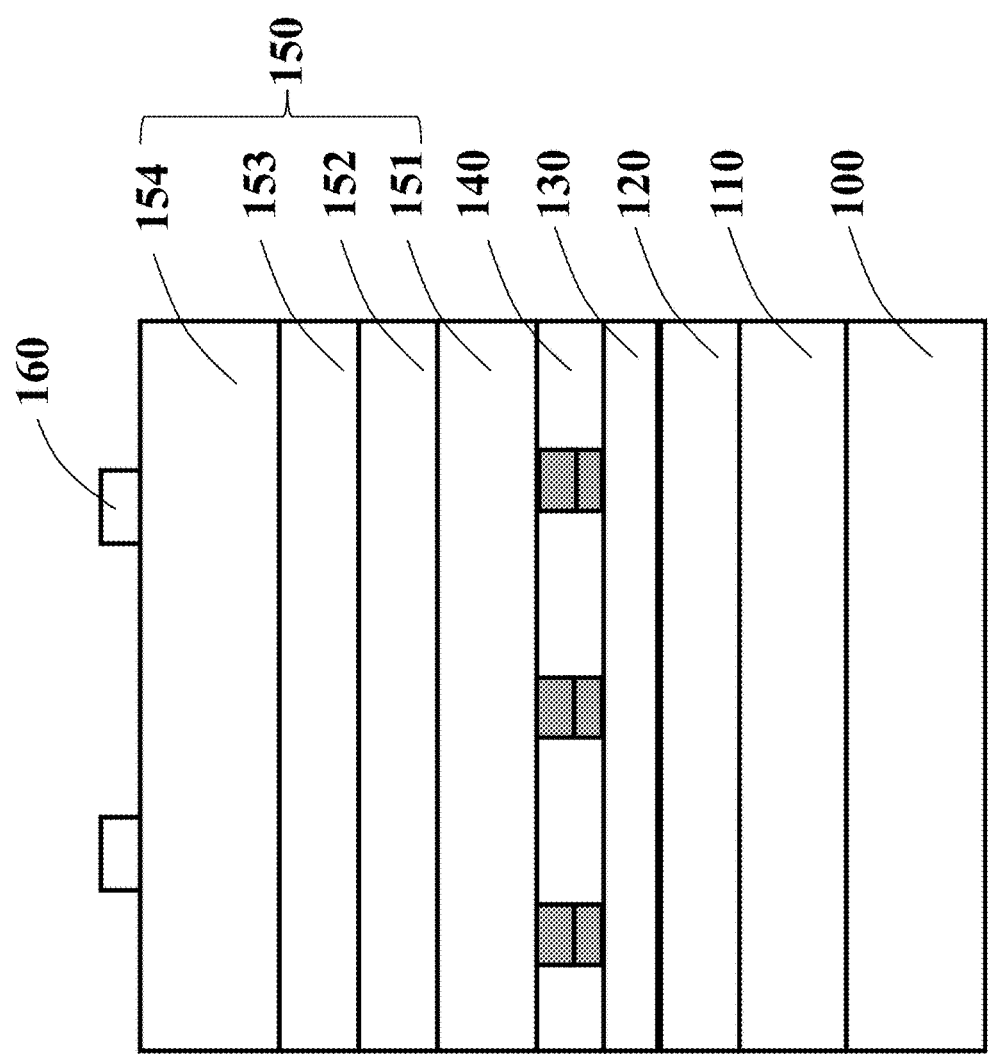
FIG. 9 is a sectional view of a sixth step of a manufacturing process for the light emitting diode as shown in FIG. 1.

With reference to FIG. 9, bond a conductive substrate 100 on the surface of the metal reflective layer via the bonding layer 110, and remove the temporary substrate 005.

In this fabrication method, thermal treatment is done before substrate bonding to form n-side ohmic contact and p-side ohmic contact. As a result, thermal treatment is not required after evaporation of the Ag reflector, which may loss luminance.

Figure 10:
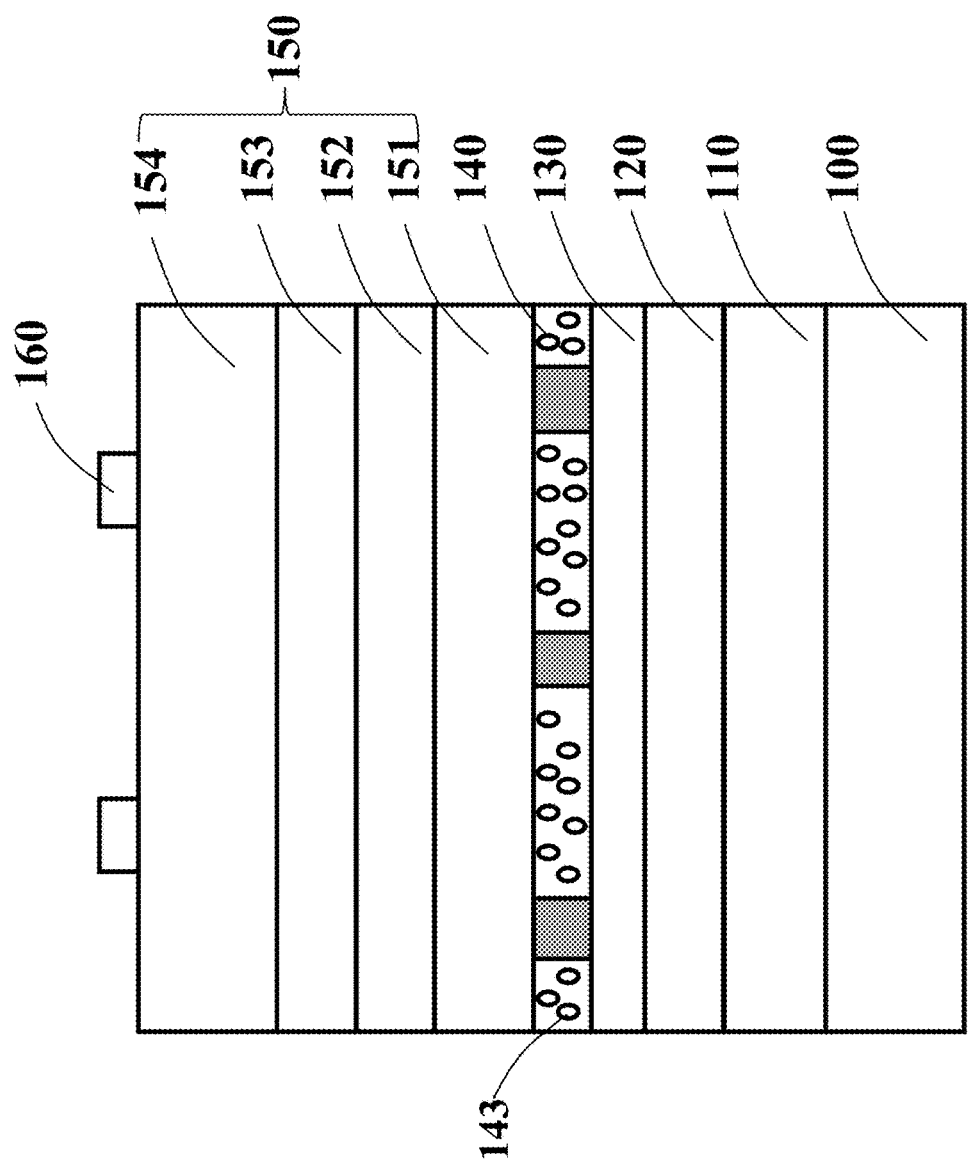
FIG. 10 is a sectional view showing the light emitting diode structure in accordance with Embodiment 2 of the present disclosure.

FIG. 10 shows the light emitting diode according to a second preferred embodiment of the present disclosure. In this embodiment, the transparent dielectric layer 140 is doped with foaming particles 143 which generate gas bubbles when heated, such as $CaCO_3$, $BaCO_3$, $Ca(HCO_3)_2$, $Na_2CO_3$, $NaHCO_3$, thereby reducing refractivity of the transparent dielectric layer 140 and achieving scattering effect. This enhances the total reflection probability of the interface between light-emitting epitaxial laminated layer 150 and the transparent dielectric layer 140. Wherein, the method for which foaming particles generate gas bubbles when heated would only change the refractivity of the transparent dielectric layer 140 without affecting smoothness of the transparent dielectric layer 140. Therefore, it would not affect smoothness and reflectivity of the mirror. In some embodiments, these foaming particles 143 are distributed at the side of the transparent dielectric layer 140 near the light-emitting epitaxial laminated layer 150.

Figure 11:
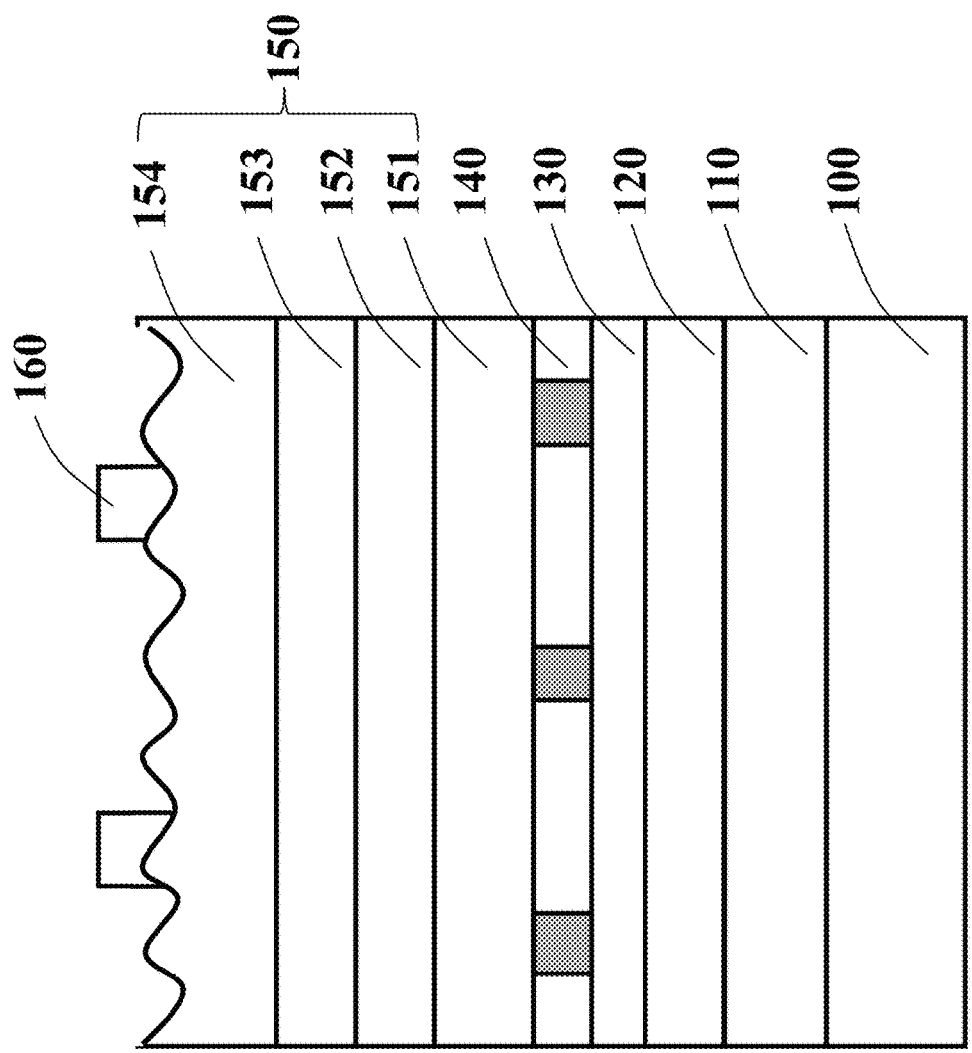
FIG. 11 is a sectional view showing the light emitting diode structure in accordance with Embodiment 3 of the present disclosure.
Figure 12:
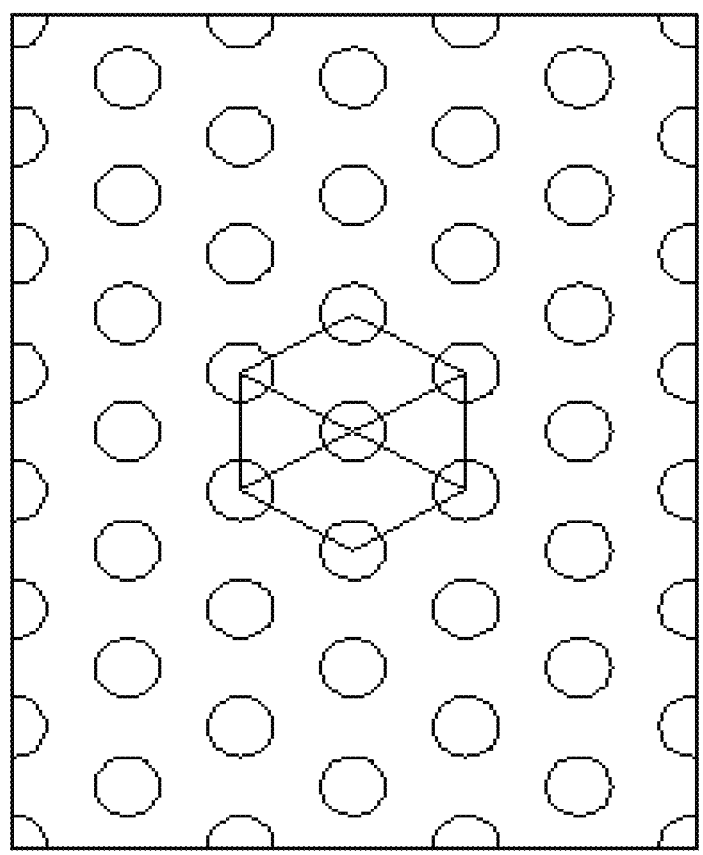
FIG. 12 shows the roughened pattern of the first surface of the light emitting diode as shown in FIG. 11.
Figure 13:
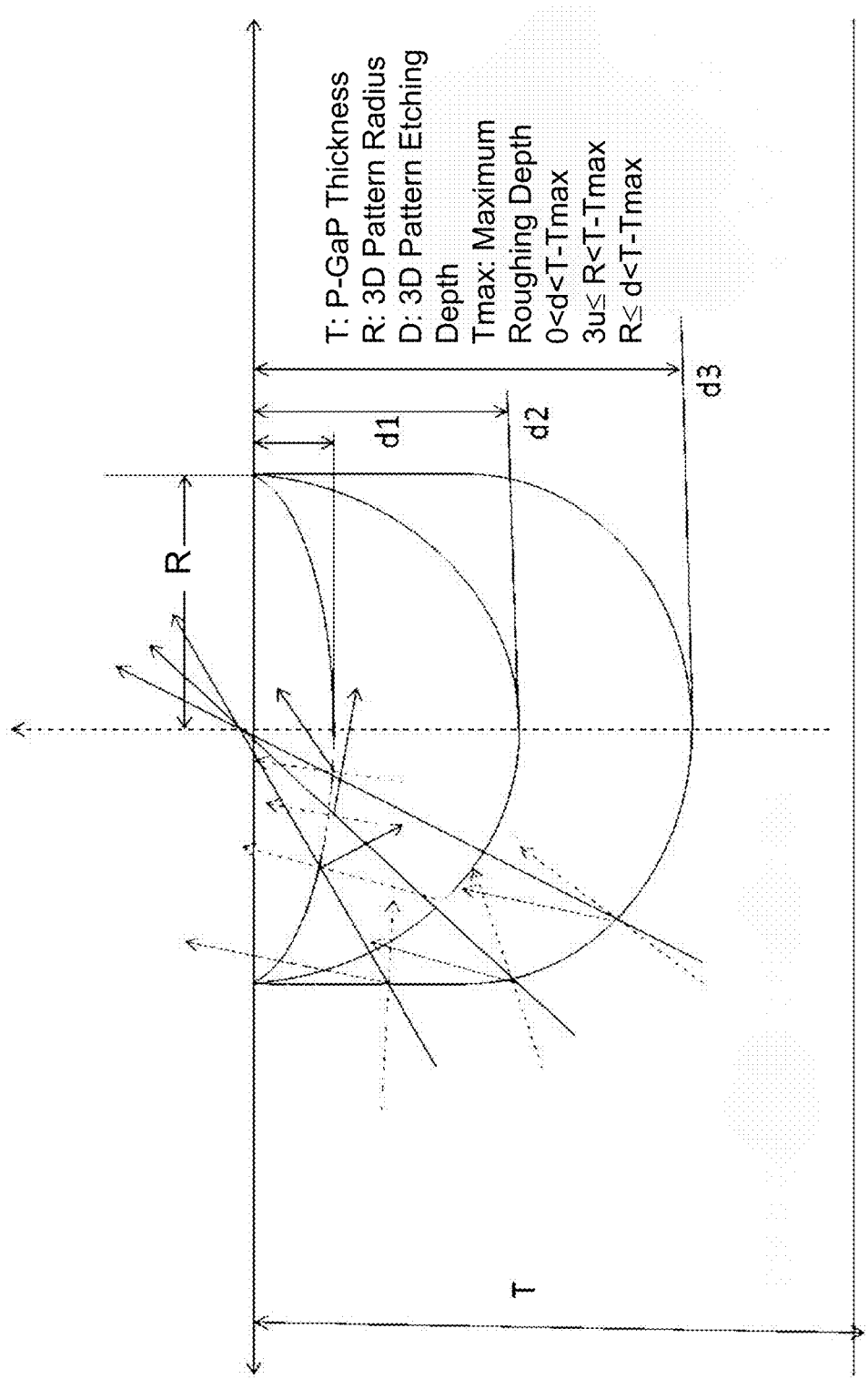
FIG. 13 shows a single hemispherical roughened pattern of the light emitting diode as shown in FIG. 11.

FIG. 11 shows the light emitting diode according to a third preferred embodiment of the present disclosure. In this embodiment, form a roughened pattern in honeycomb structure on the surface of the window layer 154, appearing in regular hexagon as shown in FIG. 12. This structure has high utility rate of space. On this basis, the roughened light-emitting area is larger than the surface area, resulting in high extraction rate. Specifically, an ideal honeycomb structure is a hemispherical structure as shown in FIG. 13. The diameter and depth should meet the requirements below: T: thickness of window layer 154, R: radius of surface 3D pattern; d: etching depth of 3D pattern; $T_{max}$: maximum roughening depth, with relationship of four parameters satisfying: $T_{max} < d < T - T_{max}$, $3u \leq R < T - T_{max}$, $R \leq d < T - T_{max}$.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting diode (LED), comprising:
   a light-emitting epitaxial laminated layer, having a first surface and a second surface that are opposite to each other, comprising an n-type semiconductor layer, a light emitting layer, and a p-type semiconductor layer;
   a transparent dielectric layer located on the second surface of the light-emitting epitaxial laminated layer that is in direct contact with the light-emitting epitaxial laminated layer, inside which are conductive holes;
   a transparent conductive layer located on one side surface of the transparent dielectric layer that is distal from the light-emitting epitaxial laminated layer;
   a metal reflective layer located on one side surface of the transparent conductive layer that is distal from the transparent dielectric layer; and
   refractivity of the transparent dielectric layer is less than refractivity of the light-emitting epitaxial laminated layer and the transparent conductive layer;

wherein the light-emitting epitaxial laminated layer, the transparent dielectric layer and the transparent conductive layer form a reflectivity-enhancing system.

2. The LED of claim 1, wherein: refractivities of the light-emitting epitaxial laminated layer, the transparent dielectric layer and the transparent conductive layer are r1, r2, and r3 respectively, with a relationship satisfying: r2<r3<r1.

3. The LED of claim 1, wherein: roughness of the second surface of the light-emitting epitaxial laminated layer is less than roughness of the first surface.

4. The LED of claim 1, wherein: the second surface of the light-emitting epitaxial laminated layer is a surface at one side of the n-type semiconductor layer.

5. The LED of claim 1, wherein: the transparent dielectric layer is doped with foaming particles configured to generate gas bubbles when heated.

6. The LED of claim 5, wherein: the foaming particles comprise at least one of $CaCO_3$, $BaCO_3$, $Ca(HCO_3)_2$, $Na_2CO_3$, or $NaHCO_3$.

7. The LED of claim 5, wherein: the foaming particles are distributed at the side of the transparent dielectric layer adjacent to the light-emitting epitaxial laminated layer.

8. The LED of claim 1, wherein: the transparent conductive layer is adhesive.

9. The LED of claim 1, wherein: the transparent conductive layer is a sputtered ITO layer.

10. The LED of claim 1, wherein: the transparent conductive layer has a thickness of 10-100 Å.

11. The LED of claim 1, wherein: the transparent conductive layer is in a molecular state, and is distributed on the transparent dielectric layer in granular shapes.

12. The LED of claim 1, wherein: the first surface of the light-emitting epitaxial laminated layer has a plurality of roughened patterns in a honeycomb structure, having a regular hexagon distribution.

13. A light-emitting system comprising a plurality of light-emitting diodes (LEDs), each LED comprising:
    a light-emitting epitaxial laminated layer, having a first surface and a second surface that are opposite to each other, comprising an n-type semiconductor layer, a light emitting layer, and a p-type semiconductor layer;
    a transparent dielectric layer located on the second surface of the light-emitting epitaxial laminated layer that is in direct contact with the light-emitting epitaxial laminated layer, inside which are conductive holes;
    a transparent conductive layer located on one side surface of the transparent dielectric layer that is distal from the light-emitting epitaxial laminated layer;
    a metal reflective layer located on one side surface of the transparent conductive layer that is distal from the transparent dielectric layer; and
    refractivity of the transparent dielectric layer is less than refractivity of the light-emitting epitaxial laminated layer and the transparent conductive layer;
    wherein the light-emitting epitaxial laminated layer, the transparent dielectric layer and the transparent conductive layer form a reflectivity-enhancing system.

14. The system of claim 13, wherein: refractivities of the light-emitting epitaxial laminated layer, the transparent dielectric layer and the transparent conductive layer are r1, r2, and r3 respectively, with a relationship satisfying: r2<r3<r1.

15. The system of claim 13, wherein: roughness of the second surface of the light-emitting epitaxial laminated layer is less than roughness of the first surface.

16. The system of claim 13, wherein: the second surface of the light-emitting epitaxial laminated layer is a surface at one side of the n-type semiconductor layer.

17. The system of claim 13, wherein: the transparent dielectric layer is doped with foaming particles configured to generate gas bubbles when heated.

18. The system of claim 17, wherein: the foaming particles comprise at least one of $CaCO_3$, $BaCO_3$, $Ca(HCO_3)_2$, $Na_2CO_3$, or $NaHCO_3$.

19. The system of claim 17, wherein: the foaming particles are distributed at the side of the transparent dielectric layer adjacent to the light-emitting epitaxial laminated layer.

* * * * *